United States Patent
Rivers, Jr.

(10) Patent No.: US 8,054,592 B2
(45) Date of Patent: Nov. 8, 2011

(54) ARC FAULT DETECTION USING FUZZY LOGIC

(75) Inventor: Cecil Rivers, Jr., West Hartford, CT (US)

(73) Assignee: General Electric Company, Schenectady, NY (US)

(*) Notice: Subject to any disclaimer, the term of this patent is extended or adjusted under 35 U.S.C. 154(b) by 483 days.

(21) Appl. No.: 12/245,415

(22) Filed: Oct. 3, 2008

(65) Prior Publication Data

US 2010/0085669 A1 Apr. 8, 2010

(51) Int. Cl.
*H02H 9/02* (2006.01)
(52) U.S. Cl. .......................................................... 361/42
(58) Field of Classification Search ...................... 361/42
See application file for complete search history.

(56) References Cited

U.S. PATENT DOCUMENTS

| | | | |
|---|---|---|---|
| 5,434,509 A * | 7/1995 | Blades | 324/536 |
| 6,002,561 A * | 12/1999 | Dougherty | 361/93.4 |
| 7,062,388 B2 | 6/2006 | Rivers, Jr. et al. | |
| 7,277,822 B2 * | 10/2007 | Blemel | 702/183 |
| 2008/0211683 A1* | 9/2008 | Curt et al. | 340/652 |
| 2009/0327201 A1* | 12/2009 | Muthu-Manivannan et al. | 706/52 |

* cited by examiner

*Primary Examiner* — Jared Fureman
*Assistant Examiner* — Scott Bauer
(74) *Attorney, Agent, or Firm* — Cantor Colburn LLP

(57) ABSTRACT

An arc fault detector which includes a filter which receives an input signal and filters the input signal, an amplifier which amplifies a signal output from the filter, an analog-to-digital converter disposed to receive the amplified signal from the amplifier and convert the amplified signal into a digital signal, and a processing unit responsive to computer executable instructions when executed thereon that receives samples of data associated with the digital signal and performs an arc detection algorithm on the data using fuzzy logic.

18 Claims, 13 Drawing Sheets

15A Resistive Arcing (High Pass Filtered)

Captured 15A Arcing

Captured 15A Arcing Absolute Value

Bit Level Waveform

Smoothed Bits

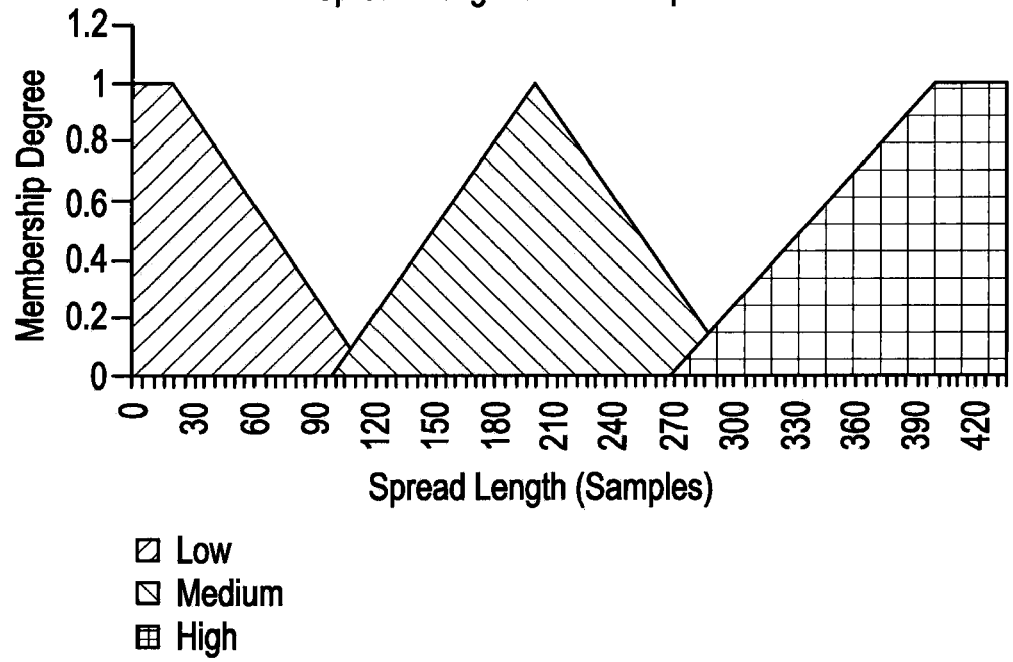
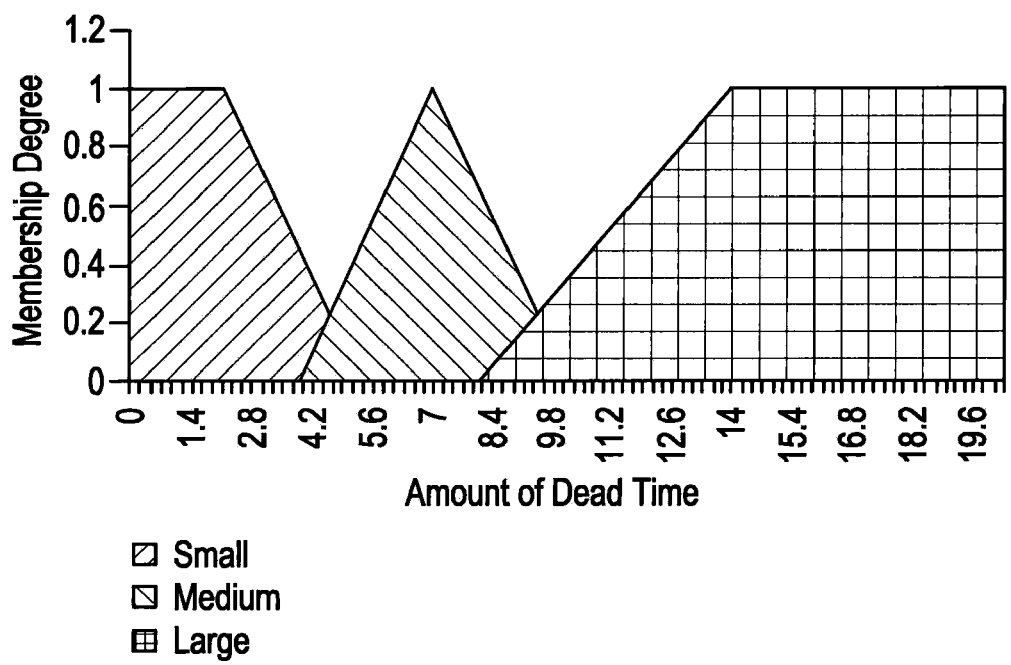

Arcing Membership Function

□ Low
◇ Medium
⊞ High

Spread Length Membership Function

□ Low
◇ Medium
⊞ High

Amount of Dead Time Membership Function

- ◨ Small
- ◪ Medium
- ⊞ Large

Arcing Membership Function

- ◨ Low
- ◪ Medium
- ⊞ High

Arcing Membership Function

Arcing Membership Function

ARC FAULT DETECTION USING FUZZY LOGIC

BACKGROUND OF THE INVENTION

This invention relates to arc fault detection in electric power systems. More particular, this invention relates to arc fault detection using fuzzy logic.

Arcing is a luminous discharge of electricity across an insulating medium. There are two types of arcing faults in AC electrical systems, which include parallel arcing faults or series arcing faults. Series arcing faults may exist when arcing occurs across a break in the line or neutral conductors or at a loose terminal in a branch circuit of a distribution network. The conductors are carrying current to a load derived from the line voltage. Since the current through the series arcing fault is limited by the impedance of the load itself and the fault is in series with the load, the fault is known as a series arcing fault. Parallel arcing faults occur when there is an unintentional conducting path between two conductors of opposite polarity, such as between a line conductor and ground. Parallel arcing faults generally involve relatively high currents, and are limited primarily by the available fault current of the circuit.

Many conventional arc fault detection methods analyze waveforms or captured data based on probability, frequency content, or amplitude. These methods can be very complex and processor intensive to determine whether arcing is present. Therefore, it is desired to provide an arc fault detection method utilizing fuzzy logic to more efficiently and detect arc faults.

BRIEF DESCRIPTION OF THE INVENTION

An exemplary embodiment of the present invention provides an arc fault detector which includes a filter which receives an input signal and filters the input signal, an amplifier which amplifies a signal output from the filter, an analog-to-digital converter disposed to receive the amplified signal from the amplifier and convert the amplified signal into a digital signal, and a processing unit responsive to computer executable instructions when executed thereon that receives samples of data associated with the digital signal and performs an arc detection algorithm on the data using fuzzy logic.

Another exemplary embodiment of the present invention provides an arc fault detection method. The method includes capturing samples of electronic data representative of measured current on a conductor of an electrical circuit, and performing an arc fault detection algorithm on the captured data using fuzzy logic to detect and protect against arc faults.

Additional features and advantages are realized through the techniques of exemplary embodiments of the invention. Other embodiments and aspects of the invention are described in detail herein and are considered a part of the claimed invention. For a better understanding of the invention with advantages and features thereof, refer to the description and to the drawings.

BRIEF DESCRIPTION OF THE DRAWINGS

FIG. 10 is a graph illustrating a spread length membership function that can be implemented within embodiments of the present invention.

FIG. 11 is a graph illustrating an amount of dead time membership function that can be implemented within embodiments of the present invention.

DETAILED DESCRIPTION OF THE INVENTION

Figure 1:
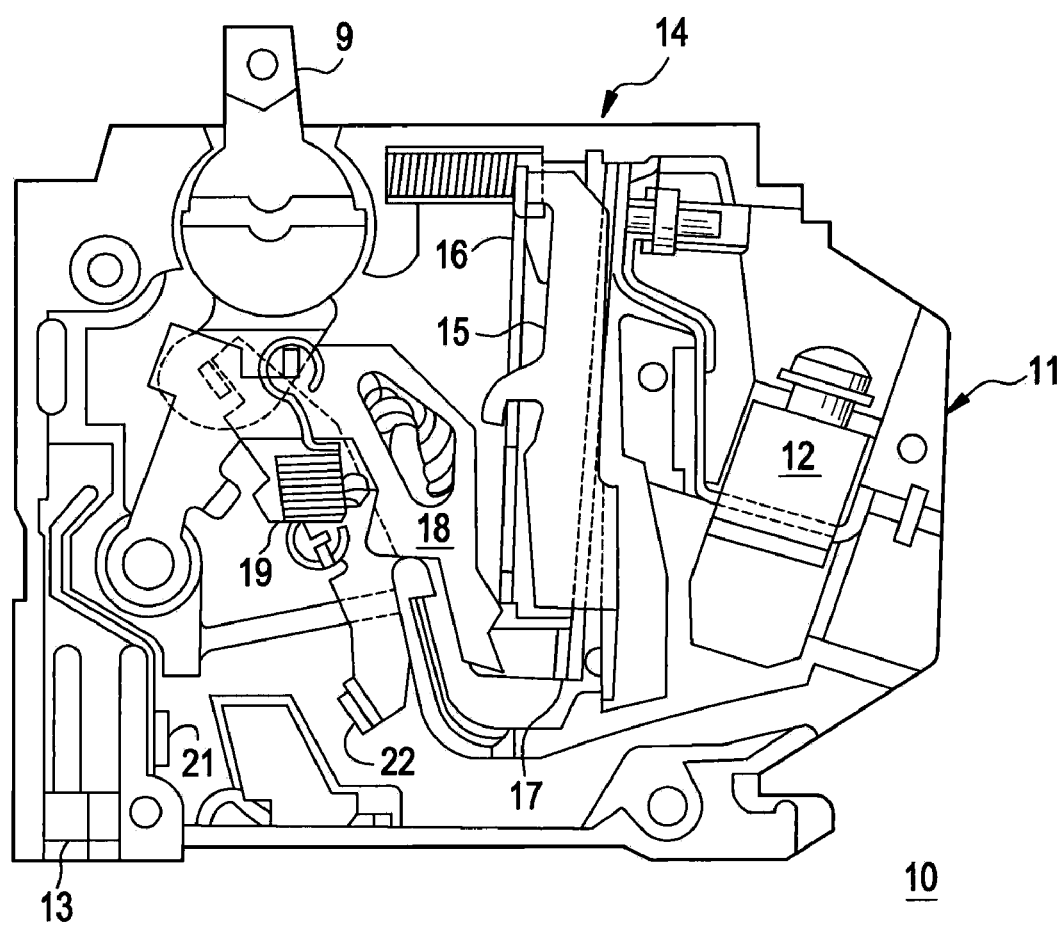
FIG. 1 is a front plan view of a circuit breaker that can be implemented within embodiments of the present invention.

Turning now to the drawings in greater detail, it will be seen that in FIG. 1, there is a circuit breaker 10 having an operating handle 9 and formed in a case 11. Current from a line of a circuit transfers from a load terminal lug 12, to a trip unit 14, to fixed and movable contacts 21 and 22 and then to a line terminal stab 13. The trip unit 14 includes a magnet 15 and an armature 16 that are operable when short circuit and short time fault conditions occur within a protected circuit. Long time overcurrent protection may be provided via a bimetal 17 of the circuit breaker 10. In addition, an operating mechanism 18 interacts with the armature 16 to hold the contacts 21 and 22 from being separated by the bias provided by an operating spring 19.

Figure 2:
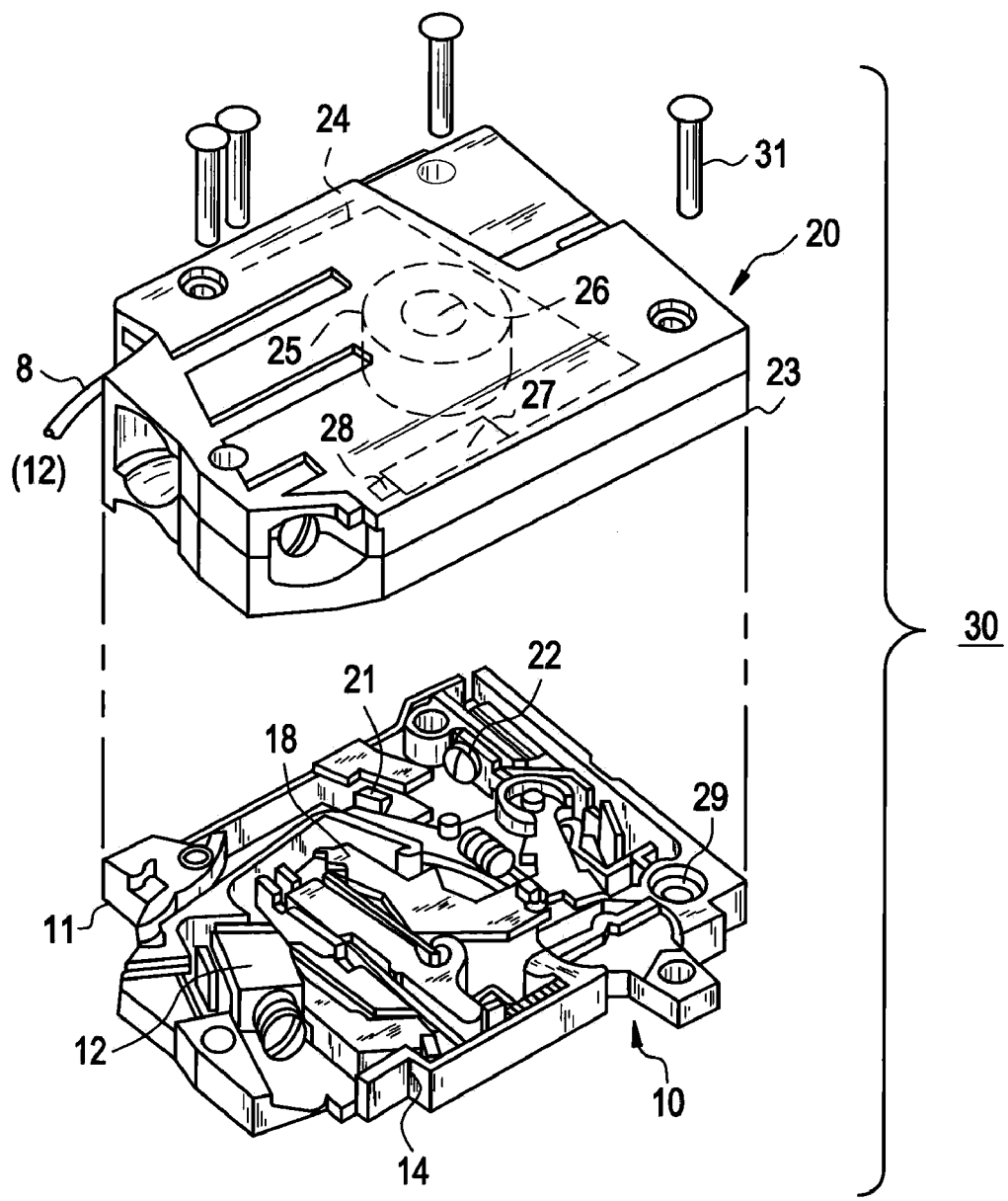
FIG. 2 is a top perspective view of the circuit breaker of FIG. 1 with an arcing fault module that can be implemented within embodiments of the present invention.

FIG. 2 illustrates an arcing fault module 20 which may be combined with the circuit breaker 10 shown in FIG. 1. In FIG.

Figure 3:
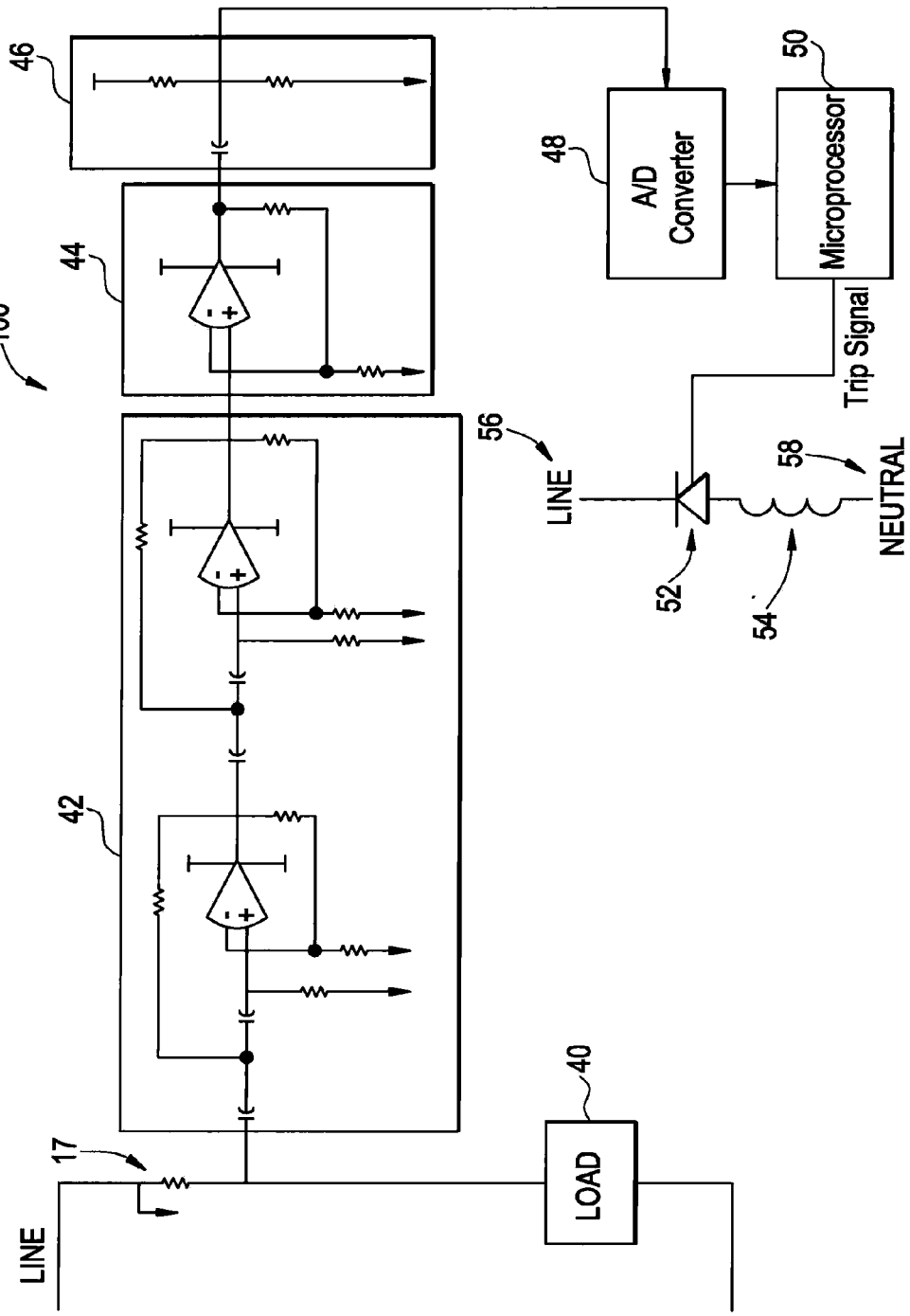
FIG. 3 is a circuit schematic diagram an arc fault detector of the arc fault module of FIG. 2 that can be implemented within embodiments of the present invention.

2, the arcing fault module 20 is formed of a case 23 and includes an air core sensing transformer 25. The current on the load terminal lug 12 is applied to the wire 8 which passes through an aperture 26 in the air core sensing transformer 25. A printed circuit board (PCB) 24 including an arc fault detection circuit (as depicted in FIG. 3) is provided. A trip solenoid 27 projects a trip armature 28 into contact with the operating mechanism 18. The arcing fault module 20 may be combined with the circuit breaker 10 via rivets 31 inserted into apertures 29. The circuit breaker 10 is connected between a line conductor 56 and a neutral conductor 58 (as depicted in FIG. 3, for example) of a protected circuit (not shown). Alternatively, according to another exemplary embodiment, the circuit breaker 10 and the arc fault module 20 may be in integrally formed as an arc fault circuit interrupter (AFCI).

FIG. 3 illustrates a circuit diagram of an arc fault detector that can be implemented within embodiments of the present invention. The arc fault detector 100 detects an arc fault condition. The arc fault detector 100 includes a high pass filter 42, for example, an amplifier 44, a DC offset 46, an analog-to-digital (A/D) converter 48 and a processing unit 50. As shown in FIG. 3, current on a line passes through the bimetal 17 to get to a load 40. The arc fault detector 100 measures the current via the bimetal 17. However, the present invention is not limited hereto and the current may be measured via current transformers (CT) or a Hall effect sensor, for example. The bimetal 17 then provides a signal representative of an input signal to the high pass filter 42 to remove 60 Hz line frequency from the measured current. According to an exemplary embodiment, by removing the 60 Hz line frequency, arcing may be accurately determined. The output of the high pass filter 42 is sent to the amplifier 44 which amplifies the signal, and sends the amplified signal to the DC offset 46, for example. According to one embodiment, the DC offset 46 shifts the signal into a range to be converted by the A/D converter 48. That is, the signal from the bimetal 17 may be positive or negative, therefore, the DC offset 46 shifts the signal to positive to be in a range to be converted by the A/D converter 48. The A/D converter 48 is disposed to receive the amplified signal from the amplifier and convert the amplified signal into a corresponding digital signal for input to the processing unit (e.g. a microprocessor) 50 to be processed. According to an exemplary embodiment, the block of samples can be captured on a per cycle basis or at various intervals of a cycle. The microprocessor 50 obtains the block of samples from the A/D converter 48, reads the samples of data and performs an arc detection algorithm using fuzzy logic which is described below in connection with FIGS. 5 through 17, to detect and protect against arc faults. As used herein, the term "fuzzy logic" is intended to mean a set of logical rules established by observation of empirical data that when exercised provides an indication of the presence or the absence of an arc fault condition. The microprocessor 50 repeatedly captures samples of data and performs the arc fault detection algorithm using fuzzy logic on the captured data over a specified period of time. When a predetermined number of arcs are detected by the microprocessor 50 in the specified time period, the microprocessor 50 generates a trip signal to turn on a switching device 52 such as a silicon-controlled rectifier (SCR). The switching device 52 then energizes a trip solenoid 54 to trip the circuit breaker 10. FIG. 3 illustrates one exemplary embodiment of the arc fault detector 100. Alternatively, the high pass filter 42 may be located in the microprocessor 50.

According to an exemplary embodiment, the arc fault detector 100 may be used for both series and parallel arc detection.

Figure 4:
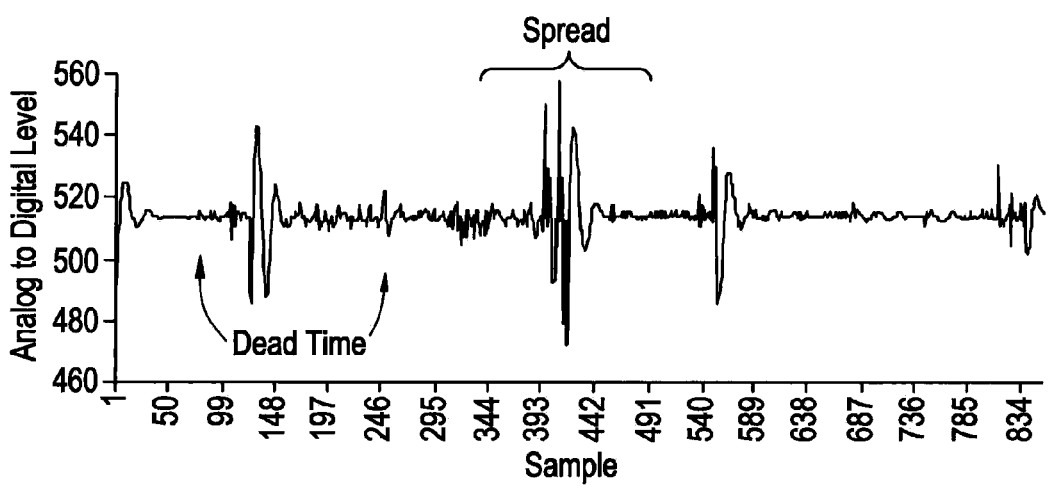
FIG. 4 is a graph of 15A resistive arcing that can be implemented within embodiments of the present invention.

When reading the samples, the microprocessor 50 determines a spread (e.g., duration of an arcing signal) and an amount of dead time (e.g., time between arc ignitions) of the data per cycle or per specified intervals of a cycle, for example, and detects arcing using fuzzy logic based on the determined spread and the amount of dead time. FIG. 4 is a graph of 15A resistive arcing that can be implemented within embodiments of the present invention. As shown in FIG. 4, the graph illustrates a shape of a waveform of the current measures at the bimetal 17, a spread of arcing and an amount of dead time (i.e., time between arc ignitions) per one cycle, for a sample which is utilized to determine arcing and non-arcing loads. In this waveform, the spread is the length of time a burst of arcing is present and the amount of dead time is the number of times no burst of arcing occurs.

Figure 5:
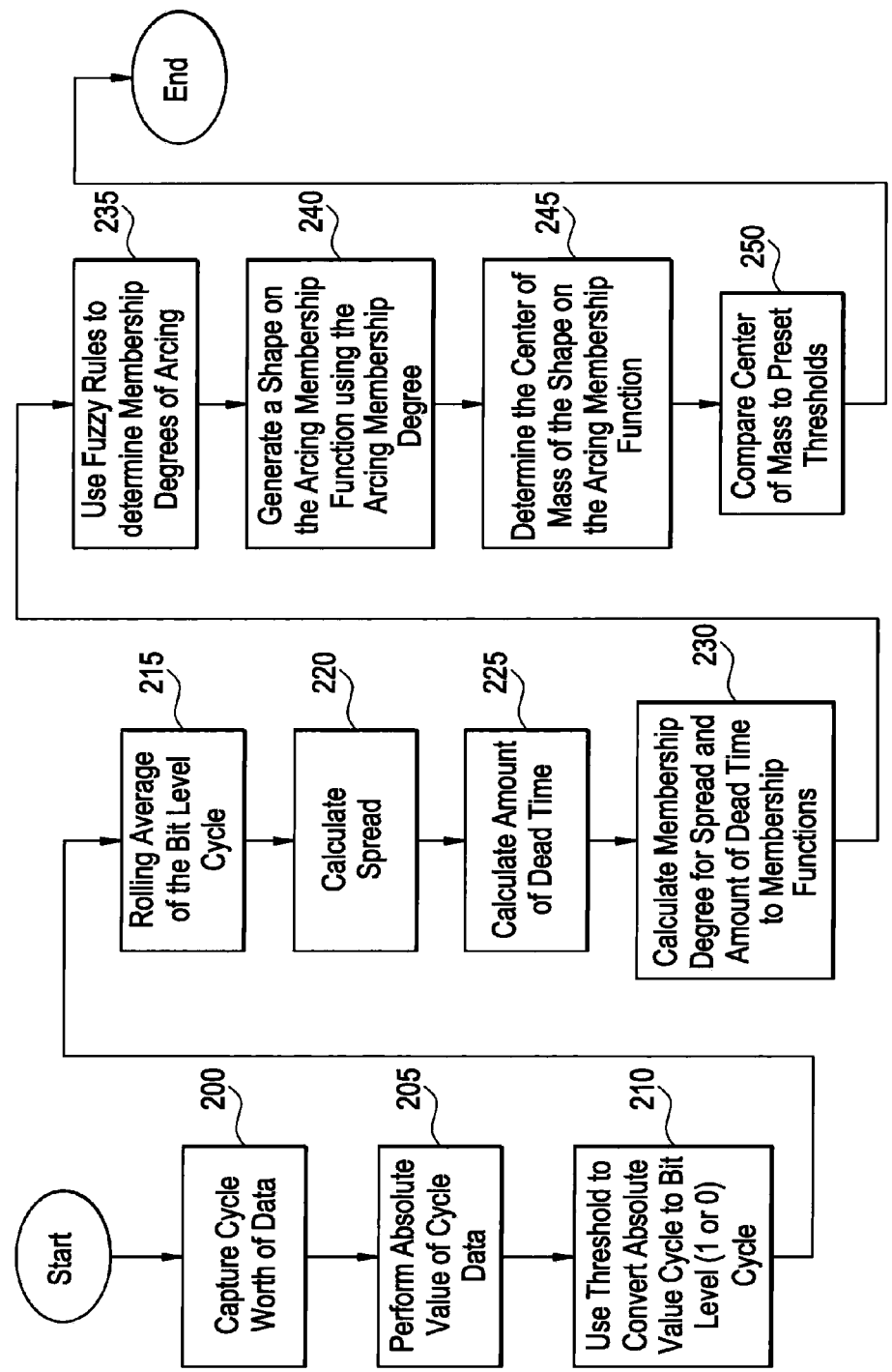
FIG. 5 is a flowchart illustrating an arcing fault detection method performed by the arc fault detector of FIG. 3 that can be implemented within embodiments of the present invention.
Figure 6:
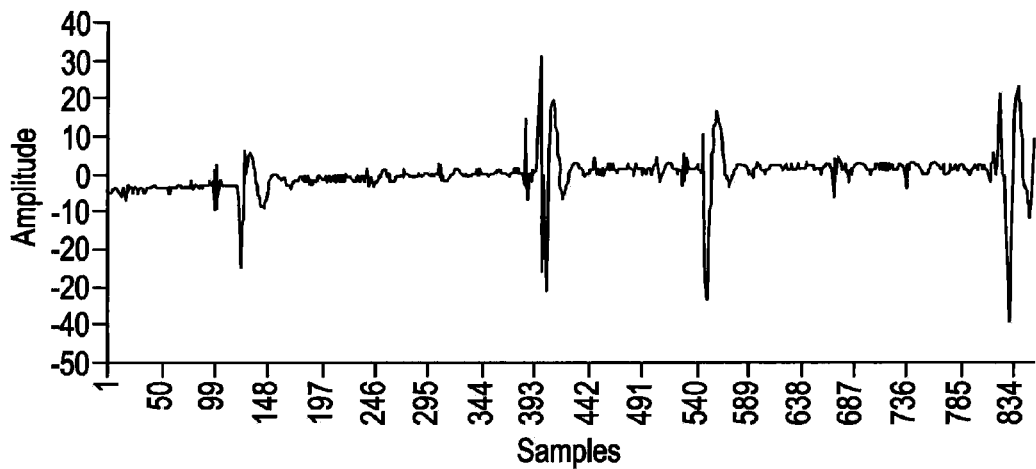
FIG. 6 is a graph illustrating an operation of capturing 15A arcing data of the method shown in FIG. 5 that can be implemented within embodiments of the present invention.
Figure 7:
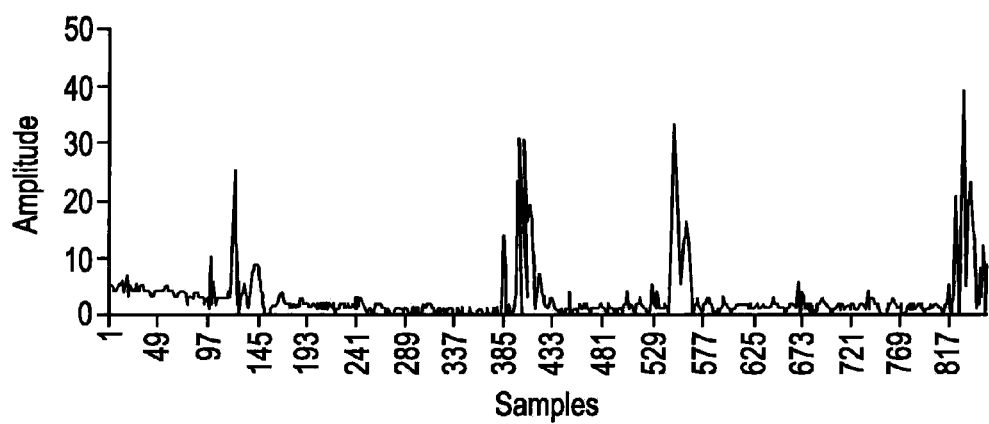
FIG. 7 is a graph illustrating an operation of obtaining an absolute value of the captured 15A arcing data of FIG. 6 that can be implemented within embodiments of the present invention.

According to an exemplary embodiment, as mentioned above, the microprocessor 50 performs an arc fault detection algorithm using fuzzy logic to determine whether arcs are present. FIG. 5 is a flow chart illustrating an arc fault detection method employing the arc fault detection algorithm according to an exemplary embodiment of the present invention, and FIGS. 6-9 and 13-17 illustrate the various operations performed in the arc fault detection method of FIG. 5 that can be implemented within embodiments of the present invention. As shown in FIG. 5, at operation 200, samples of data are captured at the microprocessor 50 (as depicted in FIG. 6) for one cycle, for example, which are representative of the measured current on a line of the circuit which is filtered through the high pass filter, converted by the A/D converter and sent to the microprocessor 50 for processing. As mentioned above, the samples may be captured on a per cycle basis or at various intervals of a cycle. From operation 200, the process moves to operation 205 where an absolute value of the captured data is obtained (as depicted in FIG. 7).

Figure 8:
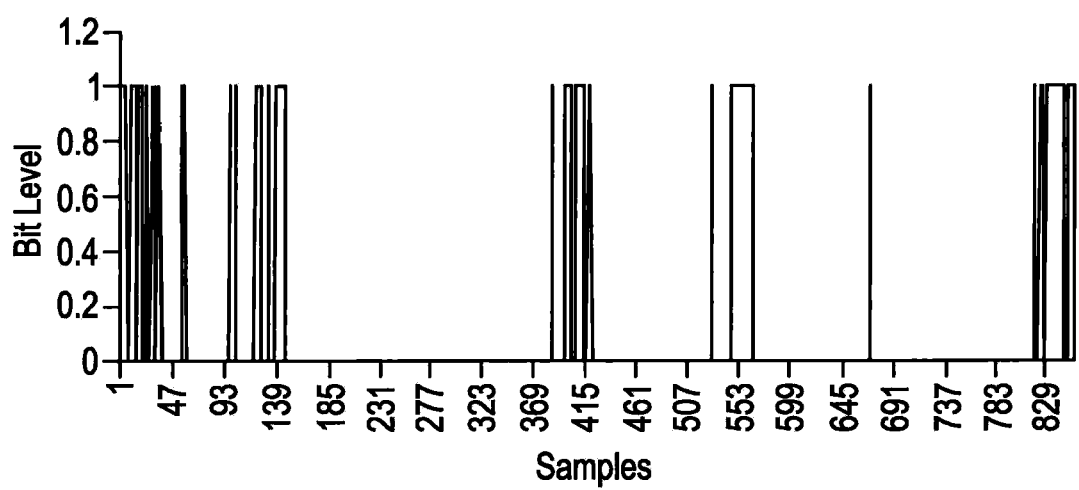
FIG. 8 is a graph illustrating an operation of determining a bit level waveform of the 15A arcing data shown in FIG. 7 that can be implemented within embodiments of the present invention.

From operation 205, the process moves to operation 210 where the absolute value of the captured data is converted into a bit level (i.e., 0 or 1) based on a predetermined threshold (as depicted in FIG. 8). According to an exemplary embodiment, the predetermined threshold is an amplitude of approximately 5, for example. However, the present invention is not limited hereto, and may vary accordingly. As shown in FIG. 8, if an amplitude of the captured data is over the predetermined threshold, it is converted a bit level of 1 and if the amplitude of the captured data is below the predetermined threshold, it is converted to a bit level of 0.

Figure 9:
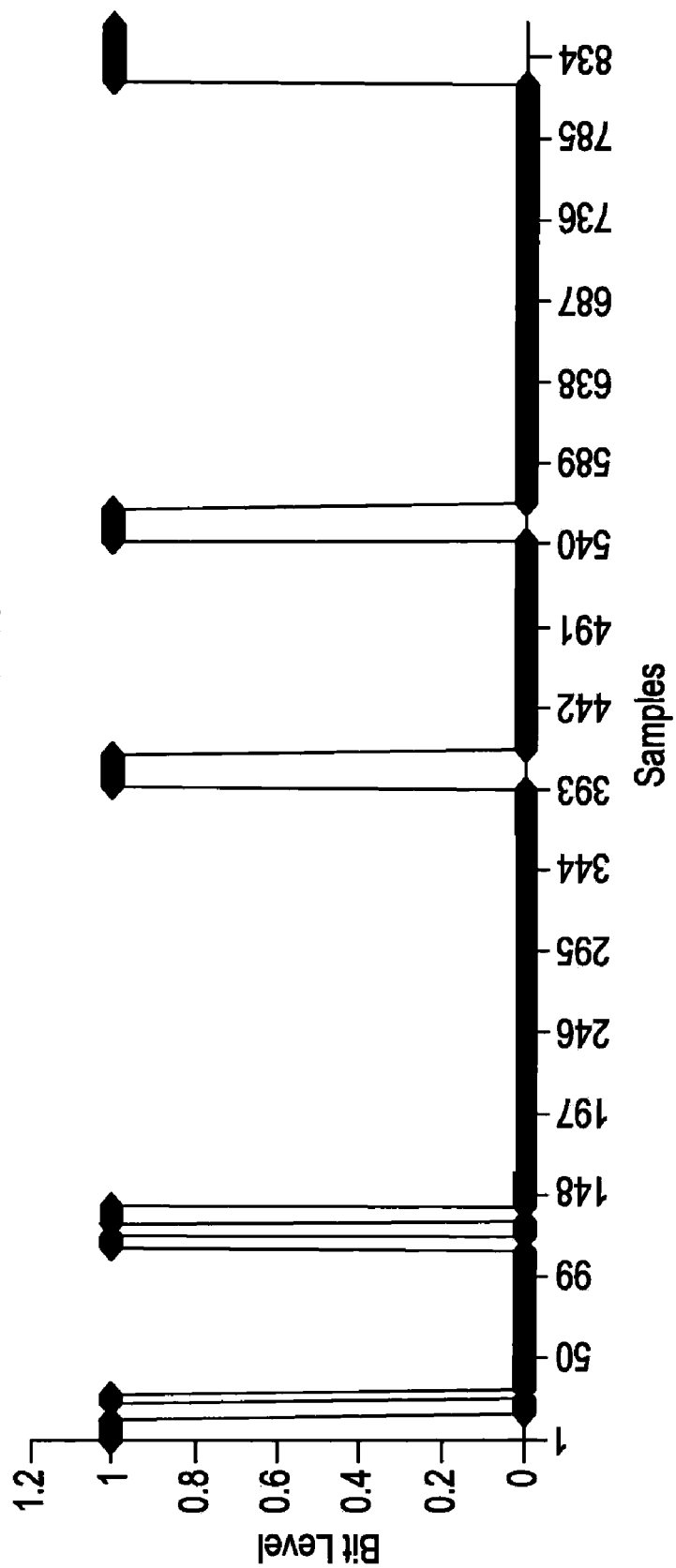
FIG. 9 is a graph illustrating operation of obtaining a rolling average of the data shown in FIG. 8 that can be implemented within embodiments of the present invention.

From operation 210, the process moves to operation 215 where a rolling average of the captured data is performed to smooth out the bit level (as depicted in FIG. 9). As shown in FIG. 9, the rolling average is performed to smooth out the data.

From operation 215, the process moves to 220 where a spread of the data is calculated. According to an exemplary embodiment, the spread is calculated by determining the average amount of time the data has a bit level of 1. That is, the spread is calculated by adding the number of ones in each block and dividing by the total number of blocks of ones to obtain the average which equals the spread of the data. From operation 220, the process moves to operation 225 where an amount of dead time is then calculated. According to an exemplary embodiment, the amount of dead time is calculated by counting the number of blocks of zeros there are between the blocks of ones. Alternatively, other methods may be used to calculate the spread, for example, a maximum, minimum or standard variation method may be used.

Figure 12:
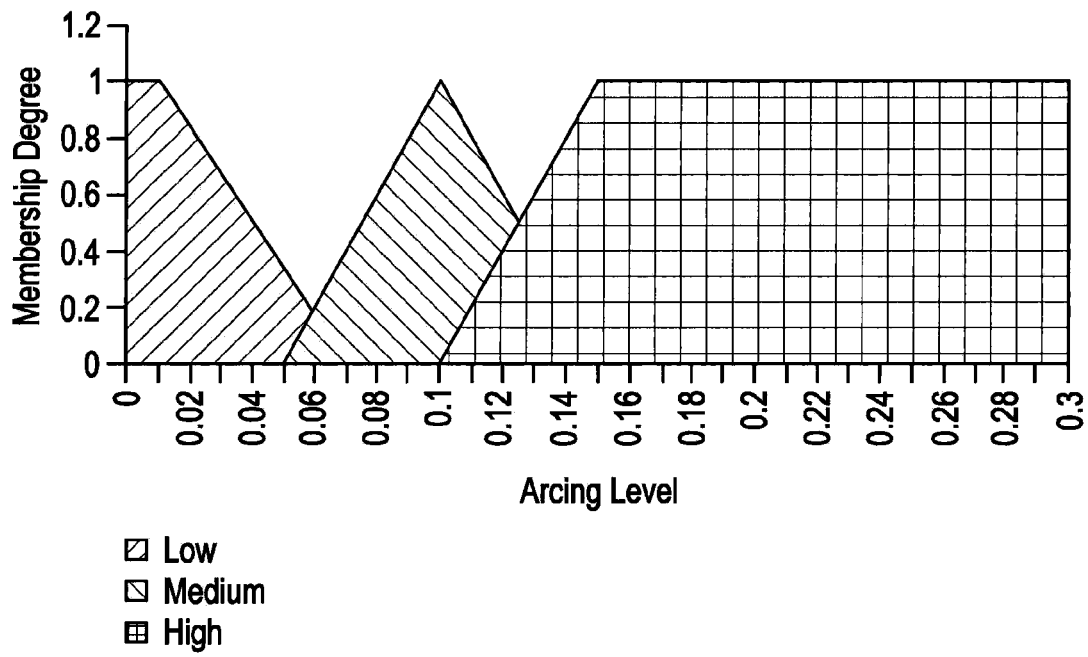
FIG. 12 is a graph illustrating an arcing membership function that can be implemented within embodiments of the present invention.
Figure 13:
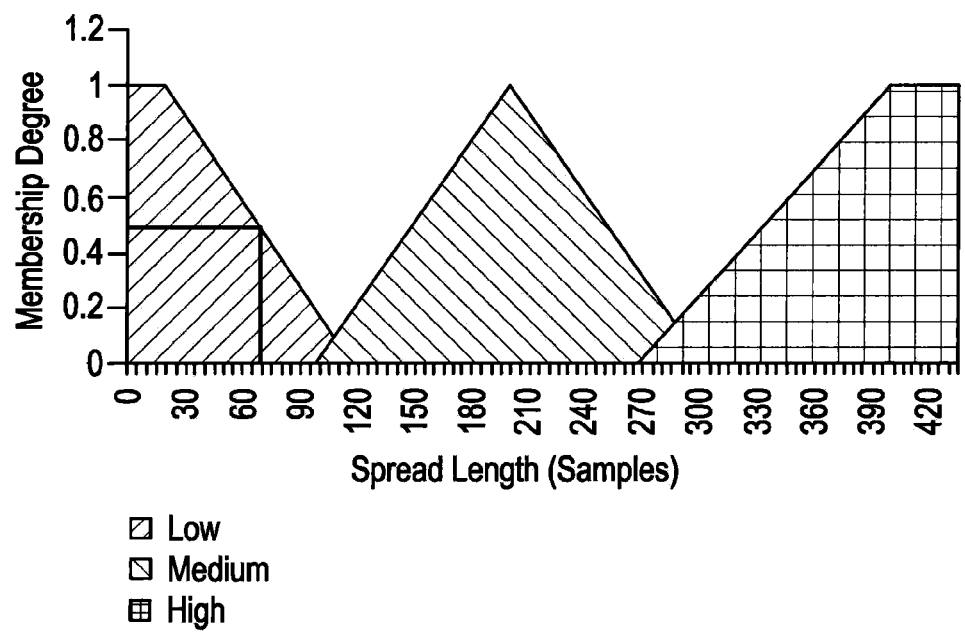
FIG. 13 is a graph illustrating an example a fuzzification operation of the spread length membership function shown in FIG. 10 that can be implemented within embodiments of the present invention.
Figure 14:
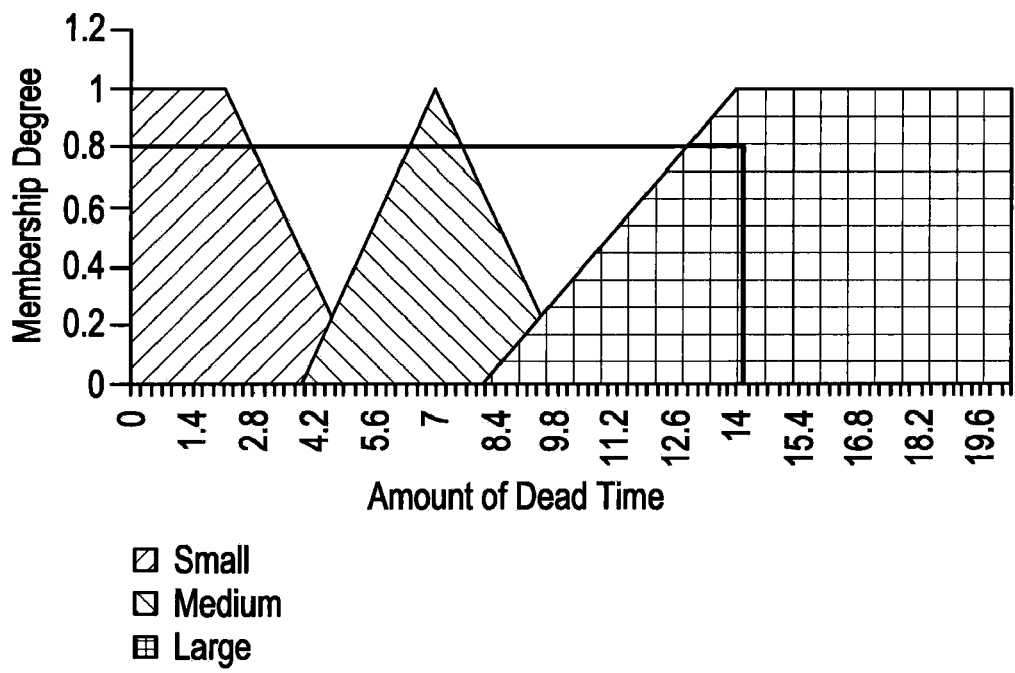
FIG. 14 is a graph illustrating an example of a fuzzification operation of the amount of dead time membership function shown in FIG. 11 that can be implemented within embodiments of the present invention.

From operation 225, the process moves to operation 230 where membership degrees for the spread and the amount of dead time are calculated based on predetermined membership functions stored in the microprocessor 50. The predetermined membership functions will now be described with reference to FIGS. 10 through 12. The predetermined membership functions map continuous variables to a truth value in the 0 to 1 range. In fuzzy logic, a membership function represents the degree of truth as an extension of valuation. According to an exemplary embodiment, these mappings are produced based on statistical data. The spread and the amount of dead time are input variables and the arcing is an output variable. FIG. 10 illustrates a graph of a spread length (i.e., samples) membership function where the spread is linked to fuzzy logic variables such as low, medium or high. FIG. 11 illustrates a graph of an amount of dead time membership function where the amount of dead time is linked to fuzzy logic variables such as small, medium or large. FIG. 12 illustrates a graph of an arcing membership function where the arcing level is linked to fuzzy logic variables such as low, medium and high. According to an exemplary embodiment, each fuzzy logic variable has a corresponding membership function mapped to the input variables, (i.e., the spread and the amount of dead time), and the output variable (i.e., arcing). The fuzzy logic variable is not limited to any particular shape and may vary accordingly. FIGS. 13 and 14 will now be described with respect to operation 230 shown in FIG. 5. In FIGS. 13 and 14, a fuzzification operation is performed to map the calculated spread and the amount of dead time to membership functions, respectively. As shown in FIG. 13, if a spread length of 65 is calculated at operation 220, a low membership degree of approximately 0.5 is determined at operation 230. As shown in FIG. 14, if an amount of dead time of 14 is calculated at operation 225, then a large membership degree of approximately 0.8 is determined at operation 230.

Figure 15:
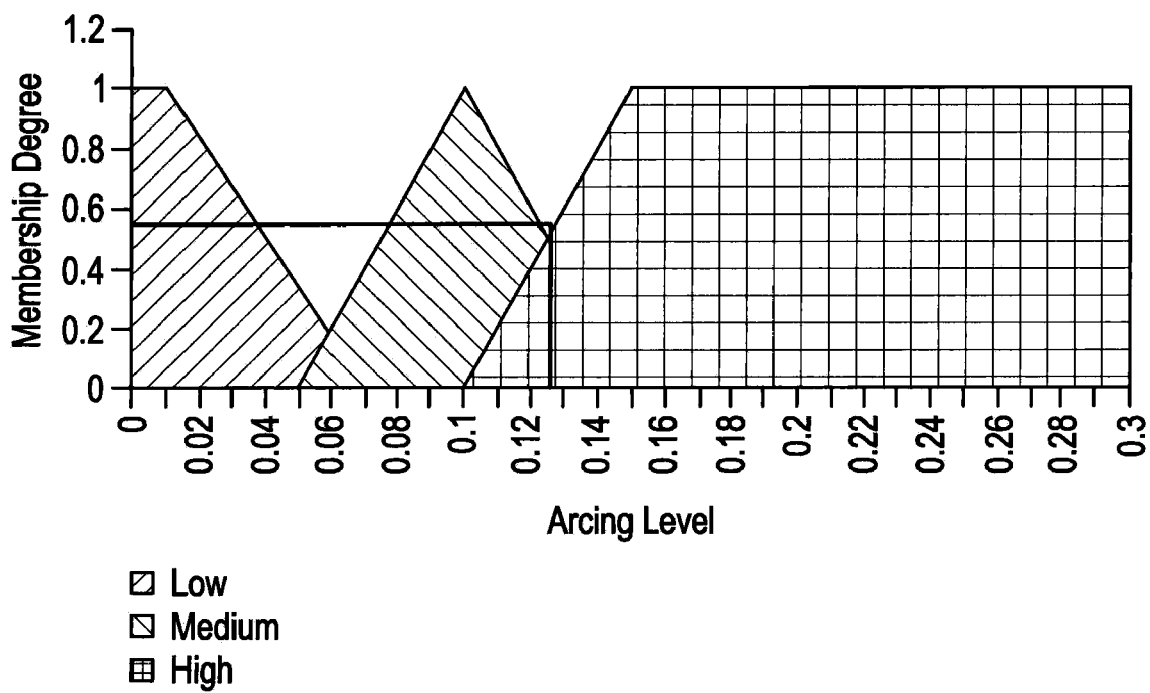
FIG. 15 is a graph illustrating the determination of an arcing membership degree using fuzzy logic that can be implemented within embodiments of the present invention.

From operation 230, the process moves to operation 235 where a set of fuzzy logic rules are used to determine an arcing membership degree and an arcing level (as depicted in FIG. 15, for example). A set of fuzzy logic rules is a set whose elements have degrees of membership. Fuzzy logic rules are if/then statements and typically include the following operators: OR, AND, and NOT where OR=MAX(A,B); AND=MIN(A,B); and NOT=1−A. According to an exemplary embodiment of the present invention, the following set of fuzzy logic rules is used to determine an arcing membership degree: 1) if the spread is high then arcing is low; 2) if the spread is low and the amount of dead time is large then arcing is high; 3) if the amount of dead time is low then arcing is low; and 4) if the spread is medium and amount of dead time is medium then arcing is medium. According to an exemplary embodiment, each fuzzy logic rule is executed in order. The present invention is not limited to any particular set of fuzzy logic rules, and may vary as necessary.

As shown in FIG. 15, for example, when inputting the calculated spread and the calculated amount of dead time to each of the fuzzy logic rules mentioned above, the results are as follows: 1) If the spread (65) is high (0) then arcing is low (0); 2) If the spread (65) is low (0.5) and the amount of dead time (14) is large (0.8) then arcing is high (0.5); 3) If the amount of dead time (14) is low (0) then arcing is low (0); and 4) if the spread (65) is medium (0) and the amount of dead time (14) is medium then arcing is high (0). Therefore, in this example, as shown in FIG. 15, based on a calculated spread of 65 and a calculated amount of dead time of 14, the arcing membership degree is 0.5 and the arcing level is high at approximately 0.13, for example.

Figure 16:
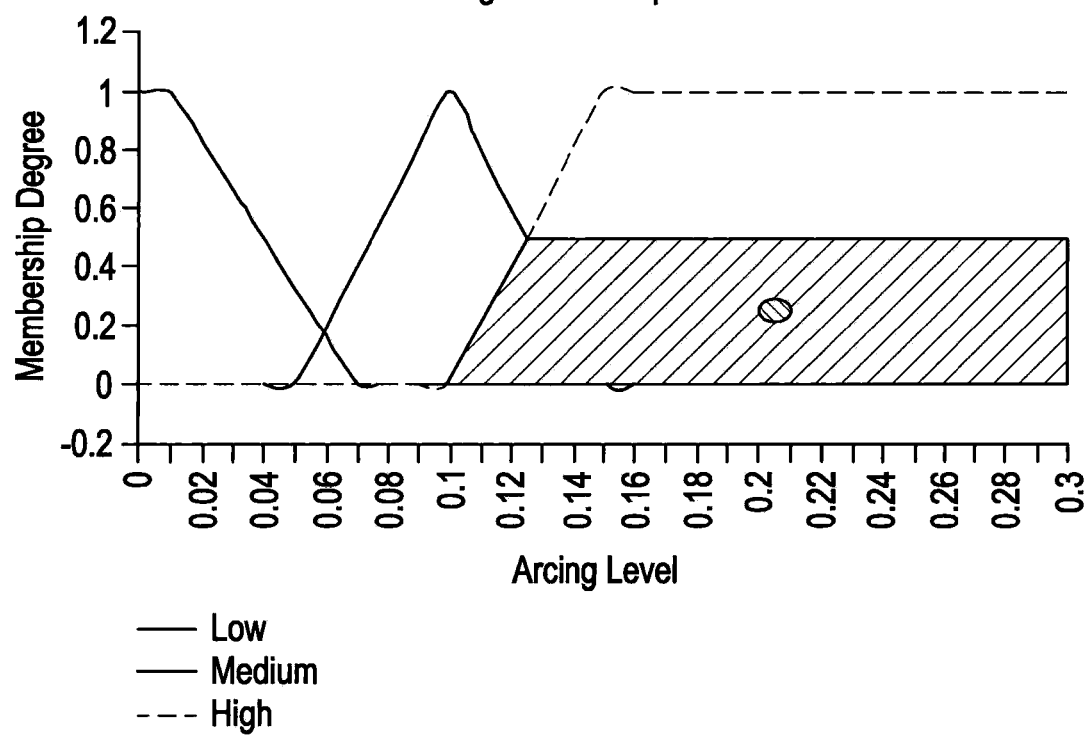
FIG. 16 is a graph illustrating an example of a defuzzification operation that can be implemented within embodiments of the present invention.
Figure 17:
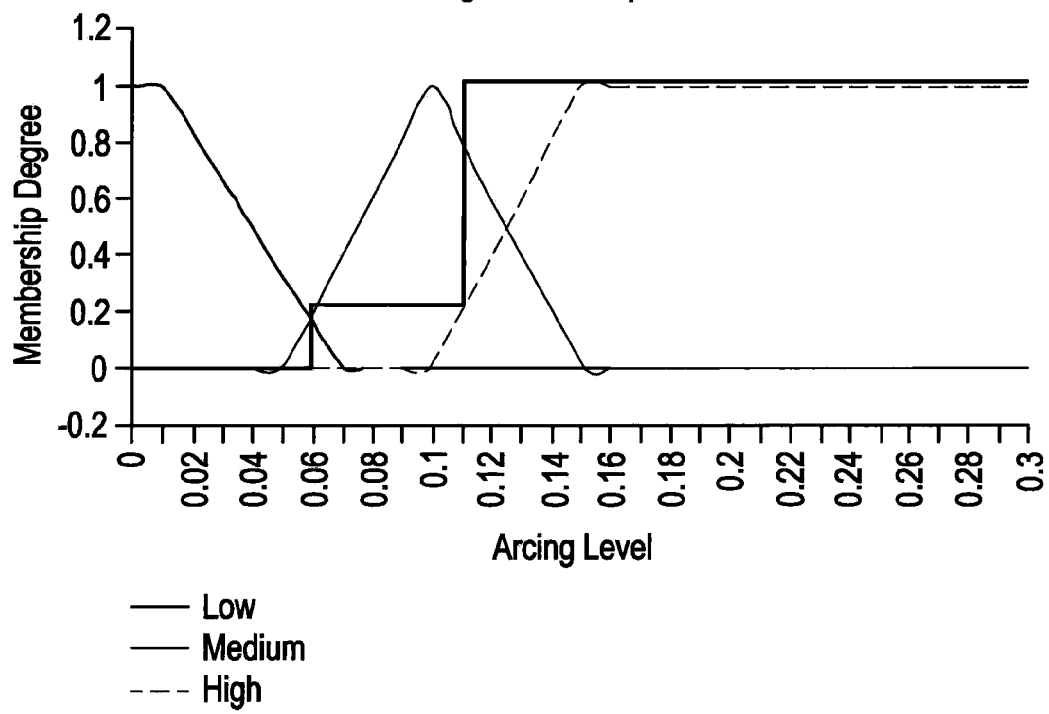
FIG. 17 is a graph illustrating an arcing determination that can be implemented within embodiments of the present invention.

From operation 235 in FIG. 15, the process moves to operation 240 where a shape of an arcing membership function is generated on the determined arcing membership degree using the calculated arcing membership degree (as depicted in FIG. 16). As shown in FIG. 16, a defuzzification process which produces a quantifiable result in fuzzy logic is performed where the shape of the arcing membership function is mapped by the arcing level and the membership degree determined in operation 235. Therefore, as shown in FIG. 16, the arcing level of 0.13 and the membership degree of 0.5 form a centroid at the high fuzzy logic variable. The present invention is not limited to the arcing level and the membership degree forming a particular shape and may vary, as necessary. That is, the shape of the arcing membership function is dependent upon the determined arcing membership degree. From operation 240, the process moves to operation 245 where a center of mass (denoted with a dot) of the shape on the arcing membership function is calculated. As shown in FIG. 16, the center of mass is approximated by finding Xcm and Ycm for a rectangle where Xcm equals b/2=0.1, b is the base of the centroid and Ycm equals h/2=0.25, h is the height of the centroid, and solving for r which equals the square root of $(Xcm^2 + Y\ cm^2)$ which in this case equals 0.269. Then, from operation 245, the process moves to operation 250 where the calculated center of mass is compared to specified thresholds to determine whether arcing is present (as depicted in FIG. 17). In the current exemplary embodiment, the specified thresholds are as follows: when the calculated center of mass is greater than approximately 0.12, the microprocessor 50 determines that arcing is present, when the calculated center of mass is between approximately 0.06 and 0.12, the microprocessor 50 determines that arcing may be present, and when the calculated center of mass is less than 0.06, the microprocessor 50 determines that arcing is not present. Therefore, since the calculated center of mass is equal to 0.269 in this example, it is determined that arcing is present. The present invention is not limited to any particular specified thresholds. Therefore, the specified thresholds may vary, as necessary. According to an exemplary embodiment, the specified thresholds are based on statistical information corresponding to arcing and non-arcing events.

According to an exemplary embodiment, the microprocessor 50 repeatedly captures samples of data and performs the arc fault detection algorithm using fuzzy logic on the capture data over a specified period of time. Therefore, when a predetermined number of arcs occur in the specified period of time, the microprocessor 50 generates a trip signal to the switching device 52 to energize the trip solenoid 54 to trip the circuit breaker 10. For example, if it is determined that arcing has occurred in 3 out of 4 cycles analyzed, then the microprocessor 50 generates the trip signal to the switching device 52. According exemplary embodiment, the specified period of time may be varied, as necessary.

Since the arc fault detector 100 identifies arcs by calculating a spread and an amount of dead time and using fuzzy logic to determine arcing, the present invention provides the advantage of accurately distinguishing between arcing and non-arcing events.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. An arc fault detector comprising:
    a filter which receives an input signal and filters the input signal;
    an amplifier which amplifies a signal output from the filter;
    an analog-to-digital converter disposed to receive the amplified signal from the amplifier and convert the amplified signal into a digital signal; and
    a processing unit responsive to computer executable instructions when executed thereon that receives samples of data associated with the digital signal and performs an arc detection algorithm on the data using fuzzy logic and to determine a spread and an amount of dead time of the data and detect arcing fuzzy logic based on the spread and the amount of dead time determined.

2. The arc fault detector of claim 1, further comprising a current sensor which measures current on a conductor of an electrical circuit, the current sensor providing a signal representative of the input signal to the filter.

3. The arc fault detector of claim 1, wherein current on a conductor of an electrical circuit is measured via a bimetal, the bimetal providing a signal representative of the input signal to the filter.

4. The arc fault detector of claim 2, wherein the filter comprises an electrical circuit that removes a fundamental line frequency from the input signal.

5. The arc fault detector of claim 1, wherein the processing unit is further responsive to the computer executable instructions to determine the spread and the amount of dead time of the data per one cycle.

6. The arc fault detector of claim 1, wherein the processing unit is further responsive to the computer executable instructions to determine the spread and the amount of dead time of the data per specified intervals of a cycle.

7. The arc fault detector of claim 5, wherein the processing unit is further responsive to the computer executable instructions to repeatedly perform the arc detection algorithm over a specified period of time, and generate a trip signal when it is determined that a predetermined number of arcs have occurred in the specified period of time.

8. An arc fault detection method comprising:
    capturing samples of electronic data representative of measured current on a conductor of an electrical circuit; and
    performing an arc fault detection algorithm on the captured data and using fuzzy logic to detect arc faults, wherein performing an arc fault detection algorithm comprises:
    determining an absolute value of the captured data;
    converting the absolute value of the captured data into a bit level based on a predetermined threshold;
    determining a rolling average of the captured data based on the bit level;
    calculating a spread and an amount of dead time of the captured data; and
    detecting arcing using fuzzy logic based on the spread and the amount of dead time calculated.

9. The arc fault detection method of claim 8, wherein capturing samples of electronic data comprises:
    measuring current on the conductor of the electrical circuit;
    filtering a fundamental line frequency from the measured current;
    amplifying a signal associated with the measured current; and
    offsetting a DC component of the amplified signal.

10. The arc fault detection method of claim 9, wherein converting the absolute value of the captured data into a bit level based on a predetermined threshold comprises:
    converting the captured data into a bit level of 1 when an amplitude of the captured data is over the predetermined threshold; and
    converting the captured data into a bit level of 0 when the amplitude of the captured data is below the predetermined threshold.

11. The arc fault detection method of claim 10, wherein calculating the spread comprises determining an average of a number of times the bit level is equal to 1, and calculating the amount of dead time comprises determining a number of times the bit level is equal to 0.

12. The arc fault detection method of claim 11, wherein detecting arcing using fuzzy logic comprises:
    calculating membership degrees based on predetermined membership functions for the spread and the amount of dead time calculated; and
    calculating an arcing membership degree and determining an arcing level based on the calculated membership degrees for the spread and the amount of dead time calculated and a predetermined arcing membership function;
    generating a shape on the predetermined arcing membership function using the calculated arcing membership degree;
    calculating a center of mass of the shape on the predetermined arcing membership function; and
    comparing the calculated center of mass to specified thresholds to determine whether arcing is present.

13. The arc fault detection method of claim 8, further comprising repeatedly capturing samples of data and performing the arc fault detection algorithm using fuzzy logic on the captured data over a specified period of time, and generating a trip signal to trip a circuit breaker when it is determined that a predetermined number of arcs have occurred in the specified time period.

14. A non-transitory storage medium encoded with machine-readable computer program code executable by computer for arc fault detection, the non-transitory storage medium including instructions for execution by the computer to implement an arc fault detection method, the method comprising:
    capturing samples of electronic data representative of measured current on a conductor of an electrical circuit; and
    performing at the processing circuit an arc fault detection algorithm on the captured data using fuzzy logic to detect and protect against arc faults, wherein performing an arc fault detection algorithm comprises:
    determining an absolute value of the captured data;
    converting the absolute value of the captured data into a bit level based on a predetermined threshold;
    determining a rolling average of the captured data based on the bit level;
    calculating a spread and an amount of dead time of the captured data; and
    detecting arcing using fuzzy logic based on the spread and the amount of dead time calculated.

15. The storage medium of claim 14, wherein converting the absolute value of the captured data into a bit level based on a predetermined threshold comprises:
    converting the captured data into a bit level of 1 when an amplitude of the captured data is over the predetermined threshold; and converting the captured data into a bit level of 0 when the amplitude of the captured data is below the predetermined threshold.

16. The storage medium of claim 15, wherein calculating the spread comprises determining an average of a number of times the bit level is equal to 1, and calculating the amount of dead time comprises determining a number of times the bit level is equal to 0.

17. The storage medium of claim 16, wherein detecting arcing using fuzzy logic comprises:
    calculating membership degrees based on predetermined membership functions for the spread and the amount of dead time calculated; and
    calculating an arcing membership degree and determining an arcing level based on the calculated membership degrees for the spread and the amount of dead time calculated and a predetermined arcing membership function;
    generating a shape on the predetermined arcing membership function using the calculated arcing membership degree;
    calculating a center of mass of the shape on the predetermined arcing membership function; and
    comparing the calculated center of mass to specified thresholds to determine whether arcing is present.

18. The storage medium of claim 14, wherein the arc fault detection method further comprises repeatedly capturing samples of data and performing the arc fault detection algorithm using fuzzy logic on the captured data over a specified period of time, and generating a trip signal to trip a circuit breaker when it is determined that a predetermined number of arcs have occurred in the specified time period.

* * * * *

UNITED STATES PATENT AND TRADEMARK OFFICE
CERTIFICATE OF CORRECTION

PATENT NO. : 8,054,592 B2  
APPLICATION NO. : 12/245415  
DATED : November 8, 2011  
INVENTOR(S) : Rivers, Jr.

Page 1 of 2

It is certified that error appears in the above-identified patent and that said Letters Patent is hereby corrected as shown below:

In Fig. 6, Sheet 6 of 13, delete

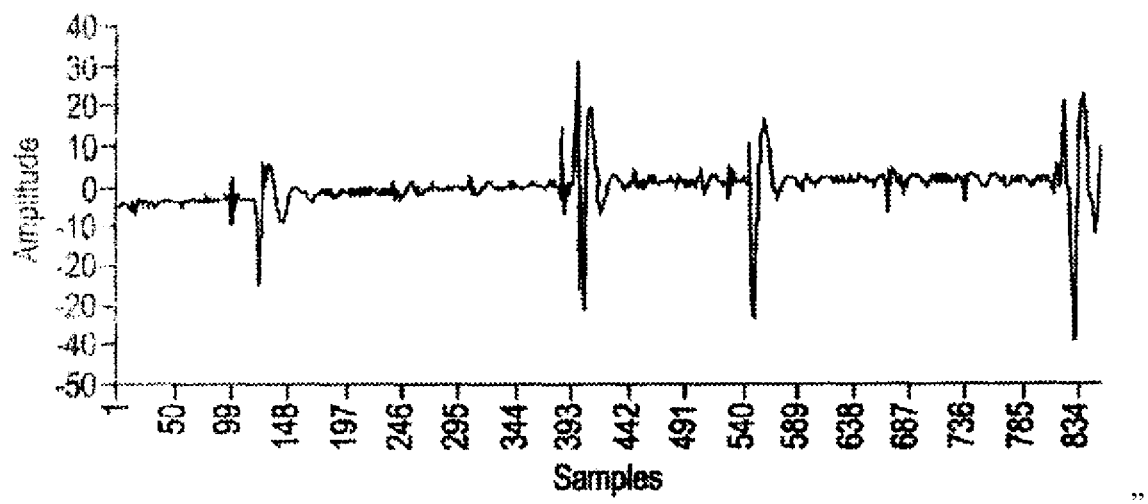

" "

and insert

Signed and Sealed this

Twentieth Day of March, 2012

David J. Kappos
*Director of the United States Patent and Trademark Office*

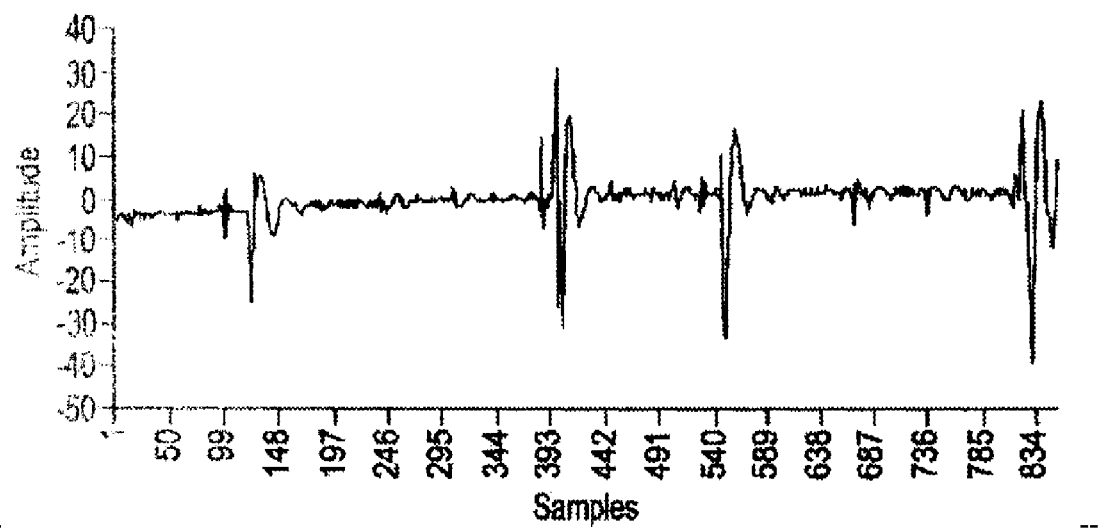
-- therefor.                                           --,
In Column 7, Line 18, in Claim 1, delete "arcing fuzzy" and
insert -- arcing using fuzzy --, therefor.